United States Patent
El-Hinnawy et al.

(10) Patent No.: US 10,916,585 B2
(45) Date of Patent: Feb. 9, 2021

(54) STACKED PHASE-CHANGE MATERIAL (PCM) RADIO FREQUENCY (RF) SWITCHES WITH IMPROVED RF POWER HANDLING

(71) Applicant: Newport Fab, LLC, Newport Beach, CA (US)

(72) Inventors: Nabil El-Hinnawy, Irvine, CA (US); Paul D. Hurwitz, Irvine, CA (US); Gregory P. Slovin, Irvine, CA (US); Jefferson E. Rose, Hawthorne, CA (US); Roda Kanawati, Irvine, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/188,782

(22) Filed: Nov. 13, 2018

(65) Prior Publication Data

US 2020/0058706 A1 Feb. 20, 2020

Related U.S. Application Data

(63) Continuation-in-part of application No. 16/161,960, filed on Oct. 16, 2018, now Pat. No. 10,644,235, and
(Continued)

(51) Int. Cl.
*H01L 27/24* (2006.01)
*H01L 45/00* (2006.01)

(52) U.S. Cl.
CPC .......... *H01L 27/2481* (2013.01); *H01L 45/06* (2013.01); *H01L 45/1286* (2013.01); *H01L 45/143* (2013.01); *H01L 45/144* (2013.01)

(58) Field of Classification Search
CPC . H01L 27/2481; H01L 45/06; H01L 45/1286; H01L 45/143; H01L 45/144
See application file for complete search history.

(56) References Cited

U.S. PATENT DOCUMENTS

| | | |
|---|---|---|
| 5,976,932 A | 11/1999 | Kerber |
| 6,448,576 B1 | 9/2002 | Davis |

(Continued)

FOREIGN PATENT DOCUMENTS

WO WO 2016/028362 2/2016

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.
(Continued)

*Primary Examiner* — Michael Jung
(74) *Attorney, Agent, or Firm* — Farjami & Farjami LLP (57) ABSTRACT

A radio frequency (RF) switching circuit includes stacked phase-change material (PCM) RF switches. The stacked PCM RF switches can include a high shunt capacitance PCM RF switch having its heating element contacts near its PCM contacts, and a low shunt capacitance PCM RF switch having its heating element contacts far from its PCM contacts. An RF voltage is substantially uniformly distributed between the high shunt capacitance PCM RF switch and the low shunt capacitance PCM RF switch. The stacked PCM RF switches can also include a wide heating element PCM RF switch having a large PCM active segment, and a narrow heating element PCM RF switch having a small PCM active segment. The wide heating element PCM RF switch will have a higher breakdown voltage than the narrow heating element PCM RF switch.

24 Claims, 6 Drawing Sheets

Related U.S. Application Data a continuation-in-part of application No. 16/114,106, filed on Aug. 27, 2018, now Pat. No. 10,707,125, and a continuation-in-part of application No. 16/103,587, filed on Aug. 14, 2018, now Pat. No. 10,461,253, and a continuation-in-part of application No. 16/103,490, filed on Aug. 14, 2018, now Pat. No. 10,476,001, and a continuation-in-part of application No. 16/103,646, filed on Aug. 14, 2018, now Pat. No. 10,475,993.

(56) References Cited

U.S. PATENT DOCUMENTS

| | | |
|---|---|---|
| 6,535,545 B1 | 3/2003 | Ben-Bassat |
| 7,522,029 B1 | 4/2009 | Lantz |
| 8,314,983 B2 | 11/2012 | Frank |
| 9,257,647 B2 | 2/2016 | Borodulin |
| 9,362,492 B2 | 6/2016 | Goktepeli |
| 9,368,720 B1 | 6/2016 | Moon |
| 9,444,430 B1 | 9/2016 | Abdo |
| 9,601,545 B1 | 3/2017 | Tu |
| 9,640,759 B1 | 5/2017 | Curioni |
| 9,891,112 B1 | 2/2018 | Abel |
| 9,917,104 B1 | 3/2018 | Roizin |
| 10,128,243 B2 * | 11/2018 | Yoo .................... H01L 27/0924 |
| 10,164,608 B2 | 12/2018 | Belot |
| 10,461,253 B1 | 10/2019 | Slovin |
| 10,529,922 B1 | 1/2020 | Howard |
| 2005/0127348 A1 | 6/2005 | Horak |
| 2006/0246712 A1 | 11/2006 | Kim |
| 2007/0075347 A1 | 4/2007 | Lai |
| 2008/0142775 A1 | 6/2008 | Chen |
| 2010/0084626 A1 | 4/2010 | Delhougne |
| 2010/0238720 A1 | 9/2010 | Tio Castro |
| 2011/0291784 A1 | 12/2011 | Nakatsuji |
| 2013/0187120 A1 | 7/2013 | Redaelli |
| 2013/0285000 A1 | 10/2013 | Arai |
| 2014/0191181 A1 | 7/2014 | Moon |
| 2014/0264230 A1 | 9/2014 | Borodulin |
| 2014/0339610 A1 * | 11/2014 | Rashed ................ H01L 29/785 257/288 |
| 2015/0048424 A1 * | 2/2015 | Tien .................... H01L 27/0207 257/208 |
| 2015/0090949 A1 | 4/2015 | Chang |
| 2015/0333131 A1 * | 11/2015 | Mojumder ............ H01L 29/401 257/390 |
| 2016/0035973 A1 | 2/2016 | Raieszadeh |
| 2016/0056373 A1 | 2/2016 | Goktepeli |
| 2016/0071653 A1 | 3/2016 | Lamorey |
| 2016/0308507 A1 | 10/2016 | Engelen |
| 2017/0092694 A1 | 3/2017 | BrightSky |
| 2017/0126205 A1 | 5/2017 | Lin |
| 2017/0187347 A1 | 6/2017 | Rinaldi |
| 2017/0207764 A1 | 7/2017 | Wang |
| 2017/0243861 A1 * | 8/2017 | Wang .................. G06F 17/5068 |
| 2017/0365427 A1 | 12/2017 | Borodulin |
| 2018/0005786 A1 | 1/2018 | Navarro |
| 2018/0194615 A1 | 7/2018 | Nawaz |
| 2018/0269393 A1 | 9/2018 | Zhang |
| 2019/0064555 A1 | 2/2019 | Hosseini |
| 2019/0067572 A1 | 2/2019 | Tsai |
| 2019/0172657 A1 | 6/2019 | Zhu |
| 2019/0267214 A1 | 8/2019 | Liu |

OTHER PUBLICATIONS

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

* cited by examiner

STACKED PHASE-CHANGE MATERIAL (PCM) RADIO FREQUENCY (RF) SWITCHES WITH IMPROVED RF POWER HANDLING

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present application is also a continuation-in-part of and claims the benefit of and priority to application Ser. No. 16/161,960, filed on Oct. 16, 2018, titled "Phase-Change Material (PCM) Radio Frequency (RF) Switch with Reduced Parasitic Capacitance,". The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds.

RF switches can be arranged in a stack in order to improve RF power handling of the switches. Different power handling requirements and breakdown voltages may be required for different RF switches in a stack, depending on where in the stack a particular RF switch is positioned; for example, based on the positions of different RF switches in a stack of switches situated between an antenna and a low noise amplifier (LNA) in a receive chain in a wireless transceiver.

Accommodating different power handling and breakdown voltages in PCM RF switches presents different challenges than accommodating different power handling and breakdown voltages in transistor RF switches. For example, there are significant RF performance tradeoffs when PCM RF switches are designed primarily around thermal performance.

Thus, there is a need in the art for stacked PCM RF switches that accommodate the different power handling and breakdown voltage requirements in a stack of PCM RF switches.

SUMMARY

The present disclosure is directed to stacked phase-change material (PCM) radio frequency (RF) switches with improved RF power handling, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
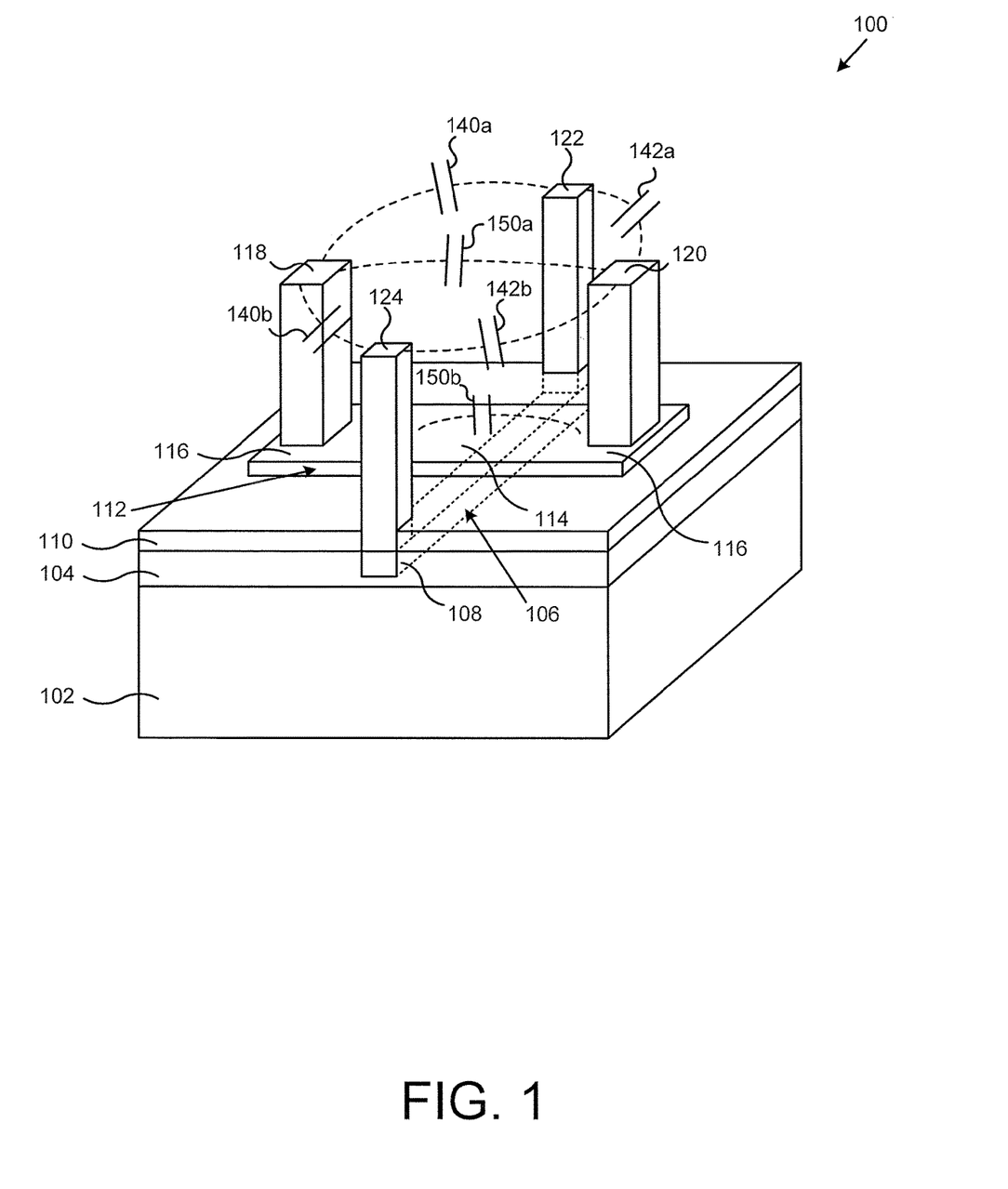
FIG. 1 illustrates a perspective view of a portion of a phase-change material (PCM) radio frequency (RF) switch according to one implementation of the present application.

FIG. 1 illustrates a perspective view of a portion of a phase-change material (PCM) radio frequency (RF) switch according to one implementation of the present application. As shown in FIG. 1, PCM RF switch 100 includes substrate 102, lower dielectric 104, heating element 106 having terminal portions 108, thermally conductive and electrically insulating material 110, PCM 112 having active segment 114 and passive segments 116, PCM contacts 118 and 120, heating element contacts 122 and 124, shunt capacitors 140a, 140b, 142a, and 142b, and series capacitors 150a and 150b. For purposes of illustration, the perspective view in FIG. 1 shows selected structures of PCM RF switch 100. PCM RF switch 100 may include other structures not shown in FIG. 1.

Substrate 102 is situated under lower dielectric 104. In one implementation, substrate 102 is an insulator, such as $SiO_2$. In various implementations, substrate 102 is a silicon (Si), silicon-on-insulator (SOI), sapphire, complementary metal-oxide-semiconductor (CMOS), bipolar CMOS (BiCMOS), or group III-V substrate. In various implementations, a heat spreader is integrated with substrate 102, or substrate 102 itself performs as a heat spreader. Substrate 102 can have additional layers (not shown in FIG. 1). In one implementation, substrate 102 can comprise a plurality of interconnect metal levels and interlayer dielectric layers. Substrate 102 can also comprise a plurality of devices, such as integrated passive devices (not shown in FIG. 1).

Lower dielectric 104 in PCM RF switch 100 is situated on top of substrate 102. As shown in FIG. 1, lower dielectric 104 is also adjacent to sides of heating element 106. Lower dielectric 104 may comprise a material with thermal conductivity lower than that of thermally conductive and electrically insulating material 110. In various implementations, lower dielectric 104 can comprise silicon oxide ($SiO_2$,) silicon nitride (SiN), or another dielectric. In various implementations, lower dielectric 104 can have a relative thickness greater or less than shown in FIG. 1.

Heating element 106 in PCM RF switch 100 is situated in lower dielectric 104. Heating element 106 also underlies PCM 112. Heating element 106 generates a crystallizing pulse or an amorphizing pulse for transforming active segment 114 of PCM 112. Heating element 106 can comprise any material capable of Joule heating. Heating element 106 can be connected to electrodes of a current source (not shown in FIG. 1) that generates a crystallizing pulse or an amorphizing pulse. Preferably, heating element 106 comprises a material that exhibits minimal electromigration or substantially no electromigration. In various implementations, heating element 106 can comprise a metal such as tungsten (W), molybdenum (Mo), titanium (Ti), titanium tungsten (TiW), titanium nitride (TiN), tantalum (Ta), nickel chromium (NiCr), or nickel chromium silicon (NiCrSi). For example, in one implementation, heating element 106 comprises tungsten lined with titanium and titanium nitride.

Thermally conductive and electrically insulating material 110 in PCM RF switch 100 is situated on top of heating element 106 and lower dielectric 104, and under PCM 112 and, in particular, under active segment 114 of PCM 112. Thermally conductive and electrically insulating material 110 ensures efficient heat transfer between heating element 106 and active segment 114 of PCM 112, while impeding electrical signals from leaking out from the path between PCM contacts 118 and 120 to heating element 106 or to other neighboring structures. Thermally conductive and electrically insulating material 110 can comprise any material with high thermal conductivity and high electrical resistivity. In various implementations, thermally conductive and electrically insulating material 110 can comprise aluminum nitride (AlN), aluminum oxide ($Al_xO_Y$), beryllium oxide ($Be_xO_Y$), silicon carbide (SiC), diamond, or diamond-like carbon.

PCM 112 in PCM RF switch 100 is situated on top of thermally conductive and electrically insulating material 110. PCM 112 includes active segment 114 and passive segments 116. Active segment 114 of PCM 112 approximately overlies heating element 106. Passive segments 118 of PCM 112 extend outward and are transverse to heating element 106, and are situated approximately under PCM contacts 118 and 120. As used herein, "active segment" refers to a segment of PCM that transforms between crystalline and amorphous phases, for example, in response to a crystallizing or an amorphizing heat pulse, whereas "passive segment" refers to a segment of PCM that does not make such transformation and maintains a crystalline phase (i.e., maintains a conductive state). With proper heat pulses and heat dissipation, active segment 114 of PCM 112 can transform between crystalline and amorphous phases, allowing PCM RF switch 100 to switch between ON and OFF states respectively.

PCM 112 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 112 can be germanium telluride having from forty percent to sixty percent germanium by composition (i.e., $Ge_XTe_Y$, where $0.4 \leq X \leq 0.6$ and $Y=1-X$). The material for PCM 112 can be chosen based upon ON state resistivity, OFF state electric field breakdown voltage, crystallization temperature, melting temperature, or other considerations. It is noted that in FIG. 1, heating element 106 extends outwards and is transverse to PCM 112. Heating element 106 is illustrated with dashed lines as seen through various structures of PCM RF switch 100. Current flowing in heating element 106 flows substantially under active segment 114 of PCM 112.

PCM contacts 118 and 120 in PCM RF switch 100 are connected to passive segments 116 of PCM 112. Similarly, heating element contacts 122 and 124 are connected to terminal segments 108 of heating element 106. PCM contacts 118 and 120 provide RF signals to and from PCM 112. Heating element contacts 122 and 124 provide power to heating element 106 for generating a crystallizing pulse or an amorphizing pulse. PCM contacts 118 and 120 and heating element contacts 122 and 124 can extend through various interlayer metal levels (not shown in FIG. 1). In various implementations, PCM contacts 118 and 120 and heating element contacts 122 and 124 can comprise tungsten (W), copper (Cu), or aluminum (Al).

Notably, various parasitic capacitors, such as shunt capacitors 140a, 140b, 142a, and 142b are formed in PCM RF switch 100. Shunt capacitor 140a is formed between PCM contact 118 and heating element contact 122, while shunt capacitor 140b is formed between PCM contact 118 and heating element contact 124. Shunt capacitor 142a is formed between PCM contact 120 and heating element contact 122, while shunt capacitor 142b is formed between PCM contact 120 and heating element contact 124. As described below, shunt capacitors 140a, 140b, 142a, and 142b provide PCM contacts 118 and 120 an electrical path to ground through heating element contacts 122 and 124.

Other parasitic capacitors of interest in the present application are "series capacitors" 150a and 150b. "Series capacitor" 150a is formed between PCM contact 118 and PCM contact 120, and "series capacitor" 150b is formed between passive segments 116 of PCM 112. It is noted that in the context of the present application, "series capacitors" is a short-hand reference to capacitors that would have been electrically in series in the stack of PCM RF switches absent the parasitic shunt capacitors discussed above; however, for ease of reference, such capacitors (i.e. capacitors 150a and 150b) are referred to as series capacitors in the present application, since they are still substantially in series. In one implementation, the capacitance value of series capacitor 150a or 150b is approximately between five femto-Farads and ten femto-Farads (5 fF-10 fF).

Figure 2A:
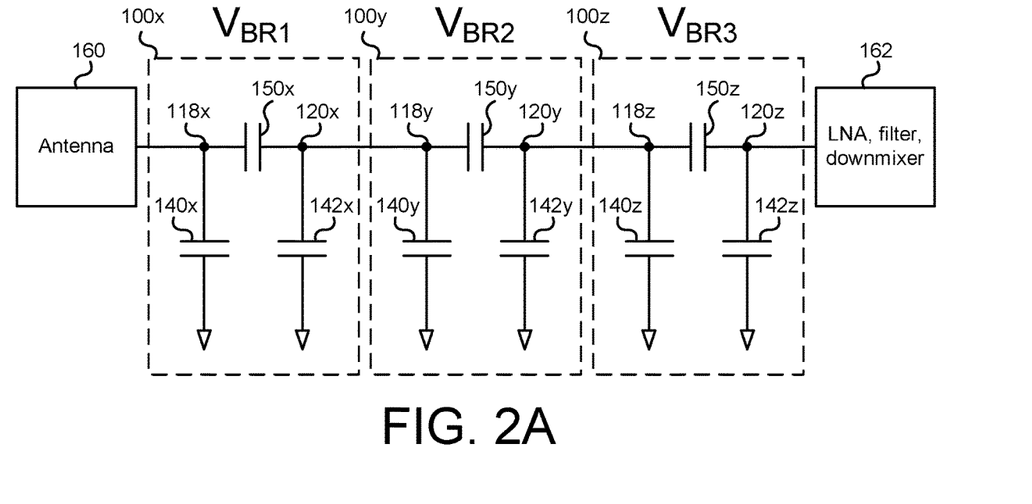
FIG. 2A illustrates a circuit model of a portion of an RF receive chain including an RF switching circuit employing stacked PCM RF switches according to one implementation of the present application.

FIG. 2A illustrates the circuit arrangement of relevant parasitic shunt and series capacitors present in an exemplary stack of PCM RF switches. Such a stack can be present, by way of the non-exhaustive example of FIG. 2A, in an RF receive chain. For ease of reference, in the present application the stacked PCM RF switches shown by way of their relevant parasitic shunt and series capacitors is also referred to as an RF switching circuit. The exemplary RF receive chain shown in FIG. 2A includes the RF switching circuit situated between antenna 160, that is an example of an RF power source in the present application, and low-noise amplifier (LNA) 162. The RF switching circuit includes three PCM RF switches 100x, 100y, and 100z. PCM RF switch 100x includes PCM contacts 118x and 120x, shunt capacitors 140x and 142x, and series capacitor 150x. PCM RF switch 100y includes PCM contacts 118y and 120y, shunt capacitors 140y and 142y, and series capacitor 150y. PCM RF switch 100z includes PCM contacts 118z and 120z, shunt capacitors 140z and 142z, and series capacitor 150z.

Each PCM RF switch 100x, 100y, and 100z in FIG. 2A generally corresponds to PCM RF switch 100 in FIG. 1. Each PCM contact 118x, 118y, and 118z corresponds to PCM contact 118 (shown in FIG. 1). Likewise, each PCM contact 120x, 120y, and 120z corresponds to PCM contact 120. Each shunt capacitor 140x, 140y, and 140z corresponds to a combination of shunt capacitors 140a and 140b (shown in FIG. 1) which exist between PCM contact 118 and heating element contacts 122 and 124. Likewise, each shunt capacitor 142x, 142y, and 142z corresponds to a combination of shunt capacitors 142a and 142b (shown in FIG. 1) which exist between PCM contact 120 and heating element contacts 122 and 124. Each series capacitor 150x, 150y, and 150z corresponds to a combination of series capacitors 150a and 150b (shown in FIG. 1) which exist between PCM contact 118 and PCM contact 120.

PCM RF switches 100x, 100y, and 100z in the RF switching circuit in FIG. 2A are shown in a "stacked" configuration. In the present example, PCM RF switch 100x is shown as most proximate to (i.e. closest to) the RF power source, i.e. to antenna 160, while PCM RF switch 100z is shown as least proximate to (i.e. farthest from) the RF power source, i.e. to antenna 160. PCM contact 120x of PCM RF switch 100x is electrically connected to PCM contact 118y of PCM RF switch 100y. Likewise, PCM contact 120y of PCM RF switch 100y is electrically connected to PCM contact 118z of PCM RF switch 100z. Thus, capacitors 150x, 150y, and 150z are in "series." PCM RF switches 100x, 100y, and 100z have respective breakdown voltages $V_{BR1}$, $V_{BR2}$, and $V_{BR3}$. Breakdown voltages $V_{BR1}$, $V_{BR2}$, and $V_{BR3}$ represent OFF state RF voltage handling capabilities for PCM RF switches 100x, 100y, and 100z respectively. Breakdown voltages $V_{BR1}$, $V_{BR2}$, and $V_{BR3}$ are measured from PCM contacts 118x, 118y, and 118z to respective PCM contacts 120x, 120y, and 120z, across respective series capacitors 150x, 150y, and 150z.

By stacking PCM RF switches 100x, 100y, and 100z as shown in FIG. 2A, the overall OFF state RF voltage handling capability for the RF switching circuit can be increased. For example, if only PCM RF switch 100x were used, the RF switching circuit may have an overall OFF state RF voltage handling capability of five volts (5 V). By stacking three PCM RF switches 100x, 100y, and 100z, the RF switching circuit may have an overall OFF state RF voltage handling capability of fifteen volts (15 V). In various implementations, the RF switching circuit can have more or fewer stacked PCM RF switches than shown in FIG. 2A.

RF voltage across the RF switching circuit can be provided from an RF power source, such as antenna 160 in FIG. 2A. When PCM RF switches 100x, 100y, and 100z are in their ON states, RF switching circuit can provide RF voltage from antenna 160 to LNA 162 with little or substantially no voltage drop. LNA 162 can amplify the RF voltage and provide it to other circuitry not shown in FIG. 2A. Additional circuitry not shown in FIG. 2A can also be connected between the RF switching circuit and antenna 160, or between the RF switching circuit and LNA 162.

As shown in FIG. 2A, parasitic shunt capacitors 140x, 140y, and 140z provide PCM contacts 118x, 118y, and 118z an electrical path to ground. Likewise, parasitic shunt capacitors 142x, 142y, and 142z provide PCM contacts 120x, 120y, and 120z an electrical path to ground. As described above, these paths are provided due to capacitive coupling with heating element contacts 122 and 124 (shown in FIG. 1). In an ideal version of the RF switching circuit, parasitic shunt capacitors 140x, 140y, 140z, 142x, 142y, and 142z would not exist, and RF voltage would be more uniformly distributed to all PCM RF switches 100x, 100y, and 100z in the RF switching circuit.

However, in practice, RF power provided by antenna 160 finds a path to ground through shunt capacitors 140x, 140y, 140z, 142x, 142y, and 142z. When the values of shunt capacitors 140x, 140y, 140z, 142x, 142y, and 142z are small relative to the values of series capacitors 150x, 150y, and 150z, the RF voltage drop is iteratively less across each PCM RF switch in the receiver chain. For example, the RF voltage drop across PCM RF switch 100y is less than the RF voltage drop across PCM RF switch 100x, due to shunt capacitors 142x and 140y diverting some of the charge coupled by series capacitor 150x. Likewise the RF voltage drop across PCM RF switch 100z is less than the RF voltage drop across PCM RF switch 100y, due to shunt capacitors 142y and 140z diverting some of the charge coupled by series capacitor 150y. As a consequence, when PCM RF switches 100x, 100y, and 100z are in their OFF states, the RF voltage across series capacitor 150y is less than the RF voltage across series capacitor 150x, and the RF voltage across series capacitor 150z is less than the RF voltage across series capacitor 150y. In other words, RF voltage is non-uniformly distributed between PCM RF switches 100x, 100y, and 100z.

Figure 2B:
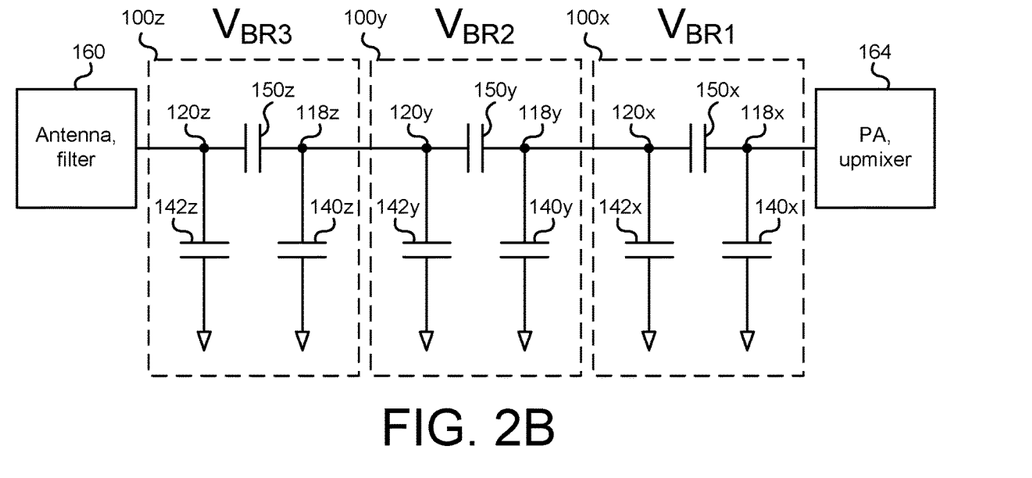
FIG. 2B illustrates a circuit model of a portion of an RF transmit chain including an RF switching circuit employing stacked PCM RF switches according to one implementation of the present application.

As another example, FIG. 2B illustrates an arrangement of relevant parasitic shunt and series capacitors in a portion of an RF transmit chain that utilizes an RF switching circuit employing stacked PCM RF switches. The transmit chain in FIG. 2B is similar to the receive chain in FIG. 2A, except for the following differences. In the transmit chain in FIG. 2B, the RF switching circuit is situated between power amplifier 164, i.e. the RF power source in the transmit chain, and antenna 160. As in FIG. 2A, PCM RF switches 100x, 100y, and 100z in the RF switching circuit in FIG. 2B are shown in a "stacked" configuration. In the example of FIG. 2B, PCM RF switch 100x is shown as most proximate to (i.e. closest to) the RF power source, i.e. to power amplifier 164, while PCM RF switch 100z is shown as least proximate to (i.e. farthest from) the RF power source, i.e. to power amplifier 164.

Although the RF switching circuits employing stacked PCM RF switches in FIGS. 2A and 2B are shown situated between antennas and amplifiers, the switching circuits can be situated between any RF power sources and RF components. For example, a switching circuit can be situated in a receive chain between an antenna and a filter. Likewise, a switching circuit can be situated in a transmit chain between a power amplifier and a filter. As another example, a switching circuit can be situated in a receive chain between an antenna and an RF input of a downconverting mixer, where an intermediate frequency (IF) or baseband output of the mixer is connected to an LNA. Likewise, a switching circuit can be situated in a transmit chain between an RF output of an upconverting mixer and an antenna, where an IF or baseband input to the mixer is provided by a power amplifier.

In one example, the RF voltage provided by the RF power source (e.g., antenna 160 in the receive chain in FIG. 2A or power amplifier 164 in the transmit chain in FIG. 2B) may be 15 volts (15 V), the voltage drop across PCM RF switch 100x may be eight volts (8 V), while the voltage drop across PCM RF switch 100y may be five volts (5 V), and the voltage drop across PCM RF switch 100z may be two volts (2 V). In this example, if PCM RF switches 100x, 100y, and 100z were designed such that each breakdown voltage $V_{BR1}$, $V_{BR2}$, and $V_{BR3}$ was five volts (5 V), the eight volts (8V) voltage drop across PCM RF switch 100x would exceed its voltage handling capability, and the RF switching circuit would experience failure.

In one solution, PCM RF switches 100x, 100y, and 100z are designed such that each breakdown voltage $V_{BR1}$, $V_{BR2}$, and $V_{BR3}$ is equal to or greater than the highest voltage drop across each respective switch. Continuing with the above example, PCM RF switches 100x, 100y, and 100z can be designed such that each breakdown voltage $V_{BR1}$, $V_{BR2}$, and $V_{BR3}$ is eight volts (8 V). However, this results in PCM switches 100y 100z having breakdown voltages $V_{BR2}$ and $V_{BR3}$ greater than the voltage drops those switches will experience during operation. That is, the eight volts (8 V) breakdown voltages $V_{BR2}$ and $V_{BR3}$ would be greater than the five volts (5 V) and two volts (2 V) voltage drops across PCM RF switches 100y and 100z. Because increased breakdown voltage trades off small signal RF performance, it is disadvantageous to over-design PCM RF switches 100y and 100z such that their breakdown voltages $V_{BR2}$ and $V_{BR3}$ are greater than their respective voltage drops.

As described below, according to one solution in the present application, the non-uniform RF voltage distribution otherwise caused by parasitic shunt capacitors 140x, 140y, 140z, 142x, 142y, and 142z, and parasitic series capacitors 150x, 150y, and 150z can be avoided. Moreover, according to another solution in the present application, each PCM RF switch can be properly and individually designed to handle a different required breakdown voltage. These two separate solutions can also be combined if so desired.

Figure 3:
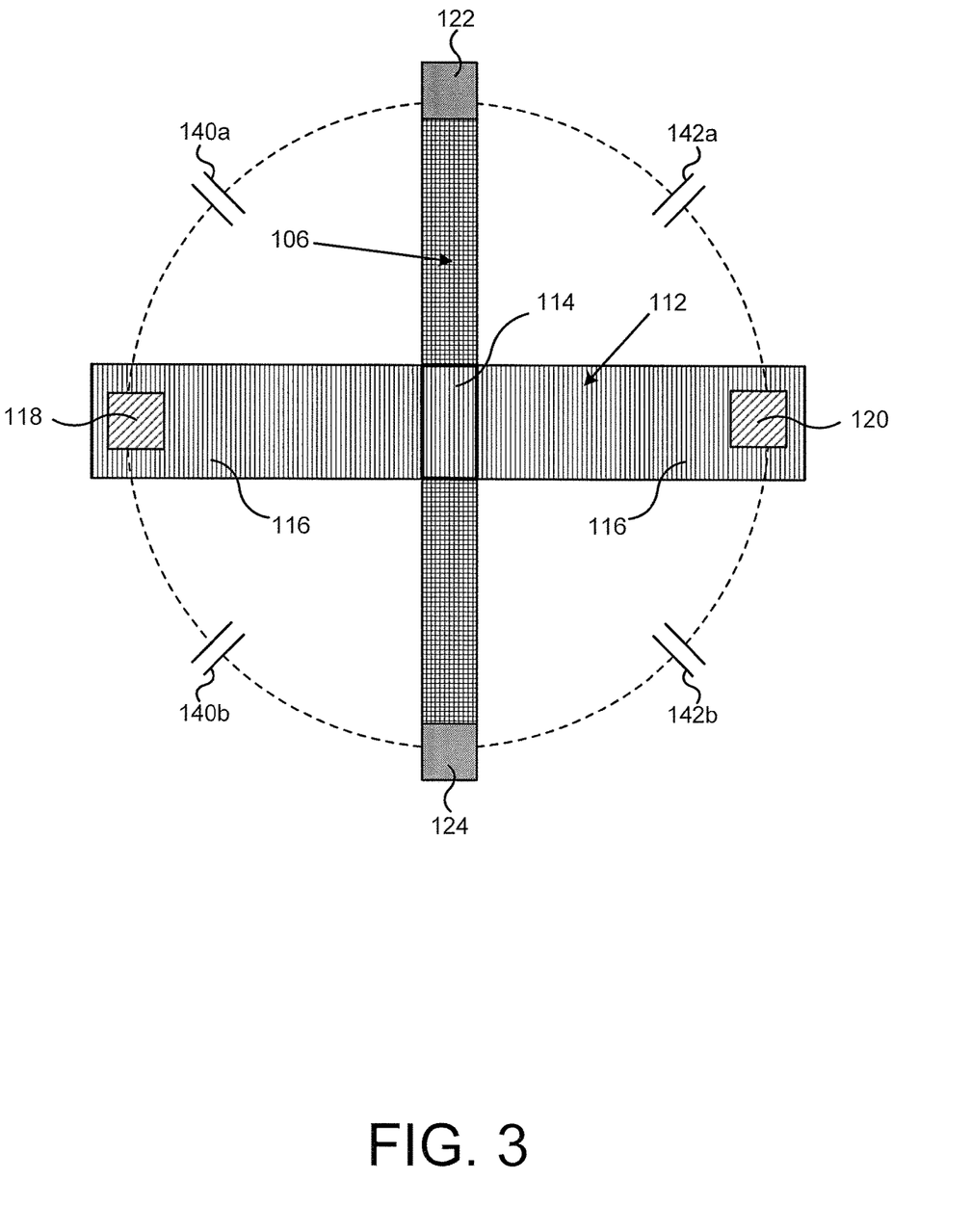
FIG. 3 illustrates a top view of a portion of a high shunt capacitance PCM RF switch according to one implementation of the present application.
Figure 4:
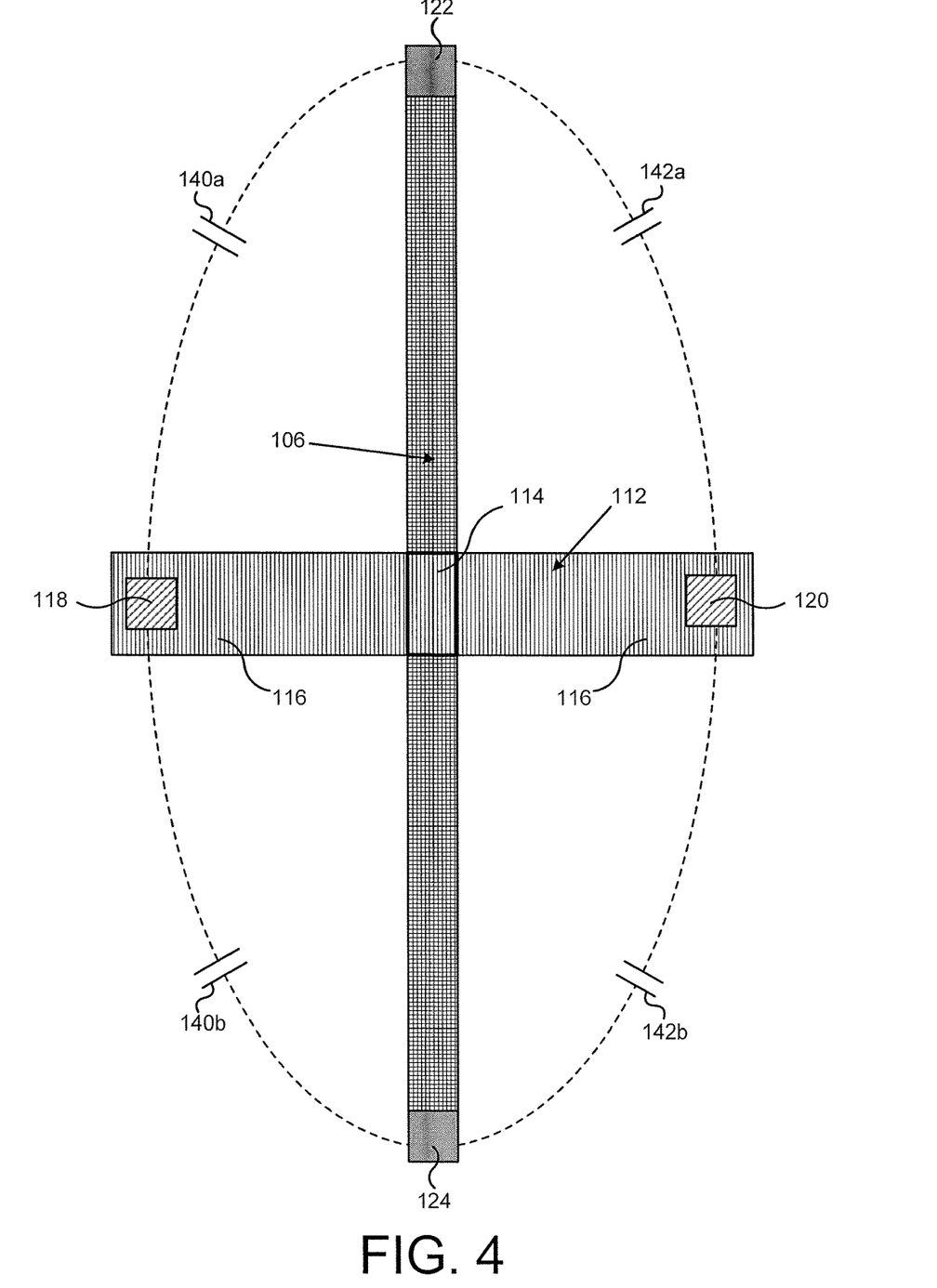
FIG. 4 illustrates a top view of a portion of a low shunt capacitance PCM RF switch according to one implementation of the present application.

Referring to FIGS. 2A and 2B, in a first solution according to the present application, the value of each shunt capacitor 140x, 140y, 140z, 142x, 142y, and 142z is designed and fabricated such that the RF voltage is substantially uniformly distributed between PCM RF switches 100x, 100y, and 100z. FIGS. 3 and 4 together illustrate one technique for designing the values of these shunt capacitors according to the present application.

FIG. 3 illustrates a top view of a portion of a high shunt capacitance PCM RF switch according to one implementation of the present application. The PCM RF switch in FIG. 3 includes heating element 106, PCM 112 having active segment 114 and passive segments 116, PCM contacts 118 and 120, heating element contacts 122 and 124, and shunt capacitors 140a, 140b, 142a, and 142b. For purposes of illustration, only selected structures of the PCM RF switch are shown in the top view in FIG. 3.

PCM RF switch in FIG. 3 is similar to the PCM RF switch in FIG. 1. In the PCM RF switch in FIG. 3, heating element 106 has a short length. Each heating element contact 122 and 124 is near PCM 112 and, more specifically, near PCM contacts 118 and 120. As a result, the value of shunt capacitors 140a, 140b, 142a, and 142b is high. In one example, the distance between heating element contact 122 or 124 and PCM contact 118 or 120 is about half a micron (0.5 um), and the value of each shunt capacitor 140a, 140b, 142a, and 142b is about two femto-Farads (2 fF).

FIG. 4 illustrates a top view of a portion of a low shunt capacitance PCM RF switch according to one implementation of the present application. The PCM RF switch in FIG. 4 includes heating element 106, PCM 112 having active segment 114 and passive segments 116, PCM contacts 118 and 120, heating element contacts 122 and 124, and shunt capacitors 140a, 140b, 142a, and 142b. For purposes of illustration, only selected structures of the PCM RF switch are shown in the top view in FIG. 4.

PCM RF switch in FIG. 4 is similar to the PCM RF switch in FIG. 3 except for the following differences. In the PCM RF switch in FIG. 4, heating element 106 has a long length. Each heating element contact 122 and 124 is far from PCM 112 and more specifically, far from PCM contacts 118 and 120. As a result, the value of shunt capacitors 140a, 140b, 142a, and 142b is low. In one example, the distance between heating element contact 122 or 124 and PCM contact 118 or 120 is about five microns (5 um), and the value of each shunt capacitor 140a, 140b, 142a, and 142b is about one fifth a femto-Farad (0.2 fF). It is noted that shunt capacitor 140a (or shunt capacitor 140b) in FIG. 3 or FIG. 4 can correspond to each shunt capacitor 140x, 140y, or 140z in FIG. 2A or 2B. Similarly, shunt capacitor 142a (or shunt capacitor 142b) in FIG. 3 or FIG. 4 can correspond to each shunt capacitor 142x, 142y, or 142z in FIG. 2A or 2B. However, due to the long length of heating element 106 in the implementation of FIG. 4, the resistance of heating element 106 in FIG. 4 is greater than the resistance of heating element 106 in FIG. 3, and heating element 106 in FIG. 4 consumes more power when generating a crystallizing pulse or an amorphizing pulse to switch the PCM RF switch between ON and OFF states respectively.

In a first solution according to the present application, the values of shunt capacitors 140x, 140y, 140z, 142x, 142y, and 142z (shown in FIGS. 2A and 2B) are adjusted by modifying the distances between their respective heating element contacts 122 and 124 and their respective PCM contacts 118 and 120 (shown in FIGS. 3 and 4), such that the RF voltage is substantially uniformly distributed across PCM RF switches 100x, 100y, and 100z (shown in FIGS. 2A and 2B). The adjustment of the values of shunt capacitors 140x, 140y, 140z, 142x, 142y, and 142z is performed according to the relative proximity of their corresponding PCM RF switches to the RF power source (for example, antenna 160 in the receive chain in FIG. 2A or power amplifier 164 in the transmit chain in FIG. 2B). For example, PCM RF switch 100x may be a low shunt capacitance switch that is shown in FIG. 4, PCM RF switch 100z may be a high shunt capacitance switch that is shown in FIG. 3, and PCM RF switch 100y may be a medium shunt capacitance switch.

In order to substantially uniformly distribute RF voltage across each PCM RF switch in the stack, according to the first solution in the present application, the values of shunt capacitors in each switch are designed according to the relative RF power that is expected to be distributed to each PCM RF switch in the stack based on the proximity of each PCM RF switch to the RF power source. For example, in an RF receive chain where, absent the present application, a higher RF voltage would be provided across the PCM RF switches closer to the RF power source relative to the PCM RF switches farther from the RF power source, the PCM RF switches closer to the RF power source are designed to have lower shunt capacitors relative to the PCM RF switches farther from the RF power source which are designed to have higher shunt capacitors.

For example, shunt capacitors 140x and 142x in the RF receive chain of FIG. 2A, or in the RF transmit chain in FIG.

2B, that are closest to the RF power source (i.e. closest to antenna 160 in the receive chain or power amplifier 164 in the transmit chain) would be designed to have lower capacitance values than shunt capacitors 140z and 142z that are farthest from the RF power source (i.e. farthest from antenna 160 in the receive chain or power amplifier 164 in the transmit chain). As such, despite shunt capacitors 140x, 140y, 140z, 142x, 142y, and 142z diverting some of the charge coupled by series capacitor 150x, 150y, and 150z in the stack, the voltage across each PCM RF switch would be substantially uniform. Once the desired values of shunt capacitors 140x, 140y, 140z, 142x, 142y, and 142z are determined based on the proximities of their corresponding PCM RF switches from the RF power source, the distances from respective heating element contacts 122 and 124 and PCM contacts 118 and 120 are correspondingly designed and fabricated so as to result in the desired capacitance values for each shunt capacitor in each PCM RF switch.

In one example, for the receive and transmit chains shown in FIGS. 2A and 2B, the distance between either heating element contact 122 or 124 and its respective PCM contact 118 or 120 for PCM RF switches 100x, 100y, and 100z may be about five microns (5 um), two microns (2 um), and a half micron (0.5 um) respectively. In this example, the values of shunt capacitors 140x and 142x may be about one fifth a femto-Farad (0.2 fF), the values of shunt capacitors 140y and 142y may be about three fifths a femto-Farad (0.6 fF), and the values of shunt capacitors 140z and 142z may be about two femto-Farads (2 fF). In one implementation, the locations of PCM contacts 118 and 120 may be modified in addition to the heating element contacts 122 and 124 as aid in achieving uniform distribution of voltages across the PCM RF switches, but additional calculations regarding influences of series capacitors 150x, 150y, and 150z may be required. In one implementation, the distance between heating element contact 122 and PCM contacts 118 and 120 may be different than the distance between heating element contact 124 and PCM contacts 118 and 120. In this implementation, an asymmetric design could result in the value of shunt capacitors 140a and 142a being less than the values of shunt capacitors 140b and 142b, while still achieving a desired combination of values for the shunt capacitors of the PCM RF switches in the chain, for example shunt capacitors 140x and 142x, or 140y and 142y, or 140z and 142z in the receive chain in FIG. 2A or the transmit chain in FIG. 2B.

Thus, according to the first solution in the present application, the desired values of shunt capacitors 140x, 140y, 140z, 142x, 142y, and 142z are determined based on the proximity of their respective PCM RF switch from to an RF power source. To implement the desired values of shunt capacitors 140x, 140y, 140z, 142x, 142y, and 142z, the distances between heating element contacts 122 and 124 and PCM contacts 118 and 120 in the PCM RF switches are according adjusted. Importantly, this solution allows each stacked PCM RF switch 100x, 100y, and 100z to be designed with the same or substantially the same breakdown voltage (i.e., $V_{BR1}=V_{BR2}=V_{BR3}$), while avoiding failures and avoiding over-designing the PCM RF switches by trading off their critical performance characteristics. For example, PCM RF switches 100x, 100y, and 100z would not be over-designed to sacrifice their small signal RF performance.

Referring again to FIGS. 2A and 2B, in a second solution according to the present application, the value of each PCM RF switch breakdown voltage is designed based on the relative proximity of the PCM RF switch to the RF power source. That is to say, the breakdown voltage $V_{BR1}$, $V_{BR2}$, and $V_{BR3}$ of each PCM RF switch 100x, 100y, and 100z is designed to correspond to the relative proximity of each PCM RF switch to the RF power source (for example, proximity to antenna 160 in the receive chain in FIG. 2A or proximity to power amplifier 164 in the transmit chain in FIG. 2B).

Figure 5:
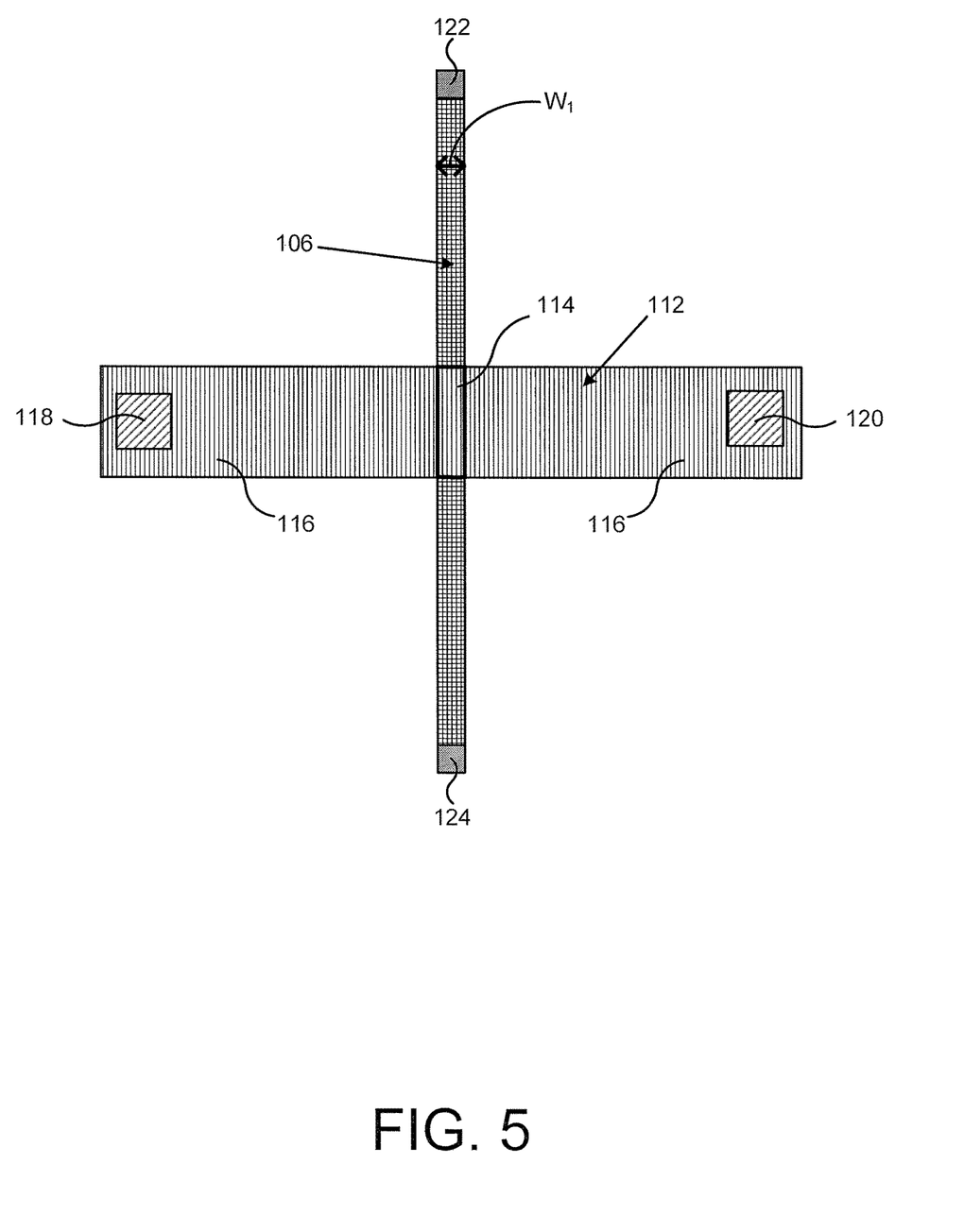
FIG. 5 illustrates a top view of a portion of a narrow heating element PCM RF switch according to one implementation of the present application.
Figure 6:
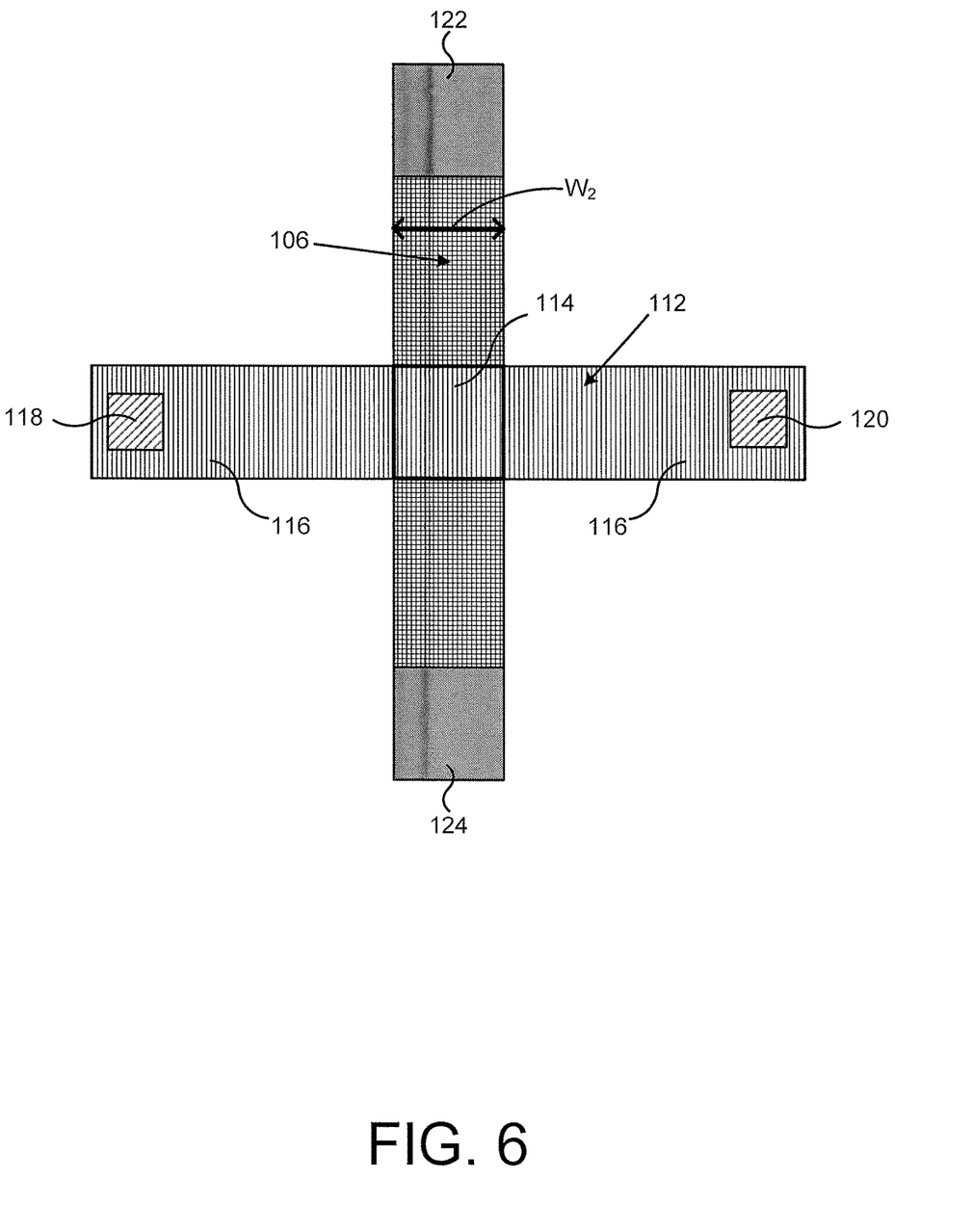
FIG. 6 illustrates a top view of a portion of a wide heating element PCM RF switch according to one implementation of the present application.

FIGS. 5 and 6 together illustrate one technique for designing the values of breakdown voltages according to the present application. FIG. 5 illustrates a top view of a portion of a narrow heating element PCM RF switch according to one implementation of the present application. The PCM RF switch in FIG. 5 includes heating element 106, PCM 112 having active segment 114 and passive segments 116, PCM contacts 118 and 120, and heating element contacts 122 and 124. For purposes of illustration, only selected structures of the PCM RF switch are shown in the top view in FIG. 5.

The PCM RF switch in FIG. 5 is similar to the PCM RF switch in FIG. 1. In the PCM RF switch in FIG. 5, heating element 106 is relatively narrow, having small width $W_1$ as shown in FIG. 5. Thus, a relatively small mass of PCM 112 overlying heating element 106 transforms into a high-resistivity amorphous phase in response to an amorphizing heat pulse from heating element 106. In other words, the size of PCM active segment 114 is relatively small. As a result, when PCM RF switch in FIG. 5 is in an OFF state, the electric field across the relatively small PCM active segment 114 is relatively strong, and the PCM RF switch cannot withstand relatively high voltages, and thus its breakdown voltage is low. In one example, width $W_1$ of heating element 106 in FIG. 5 is about two tenths of a micron (0.2 um), and the breakdown voltage of the PCM RF switch is about two volts (2 V).

FIG. 6 illustrates a top view of a portion of a wide heating element PCM RF switch according to one implementation of the present application. The PCM RF switch in FIG. 6 includes heating element 106, PCM 112 having active segment 114 and passive segments 116, PCM contacts 118 and 120, and heating element contacts 122 and 124. For purposes of illustration, only selected structures of the PCM RF switch are shown in the top view in FIG. 6.

The PCM RF switch in FIG. 6 is similar to the PCM RF switch in FIG. 1. In the PCM RF switch in FIG. 6, heating element 106 is relatively wide, having large width $W_2$ as shown in FIG. 6. Thus, a relatively large mass of PCM 112 overlying heating element 106 transforms into a high-resistivity amorphous phase in response to an amorphizing heat pulse from heating element 106. In other words, the size of PCM active segment 114 is relatively large. As a result, when PCM RF switch in FIG. 6 is in an OFF state, the electric field across the relatively large PCM active segment 114 is relatively weak, and the PCM RF switch can withstand relatively high voltages, and thus its breakdown voltage is high. In one example, width $W_2$ of heating element 106 in FIG. 6 is about one micron (1 um), and the breakdown voltage of the PCM RF switch is about eight volts (8 V).

In the second solution according to the present application, the values of breakdown voltages $V_{BR1}$, $V_{BR2}$, and $V_{BR3}$ (shown in FIGS. 2A and 2B) are designed by setting the width of heating element 106 (shown as $W_1$ in FIG. 5, and as $W_2$ in FIG. 6) based on the proximity of each PCM RF switch to the RF power source. Thus, breakdown voltages $V_{BR1}$, $V_{BR2}$, and $V_{BR3}$ correspond to the expected voltage drops across PCM RF switches 100x, 100y, and 100z respectively. For example, PCM RF switch 100x may be a wide heating element switch as shown in FIG. 6 that has a high breakdown voltage, PCM RF switch 100z may be a narrow heating element switch as shown in FIG. 5 that has a low breakdown voltage, and PCM RF switch 100y may be a medium width heating element switch that has a medium breakdown voltage.

By uniquely designing the width of heating element 106 for each PCM RF switch according to the present application, PCM RF switches 100x, 100y, and 100z are not over-designed and do not sacrifice small signal RF performance. Further, the layout and dimensions of PCM 112 and PCM contacts 118 and 120 are relatively constant in PCM RF switches 100x, 100y, and 100z. Since PCM 112 and PCM contacts 118 and 120 are critical structures for transferring RF power, these structures can be relatively consistently fabricated for all stacked PCM RF switches, which results in improved reliability of the RF switching circuit.

It is noted that increasing or reducing the width of heating element 106 might affect the width of heating element contacts 122 and 124, and thus might impact the values of shunt capacitors 140x, 140y, 140z, 142x, 142y, and 142z. Such impact may be insignificant at widths of approximately one micron (1 um) or less. However, in another implementation, the possible impact on the shunt capacitors can be offset by designing the values of shunt capacitors 140x, 140y, 140z, 142x, 142y, and 142z, in response to the different widths of heating element 106.

In one implementation, the first and second solutions in the present application are both utilized. Low shunt capacitance PCM RF switches and high shunt capacitance PCM RF switches and can be used to mitigate the otherwise non-uniform voltage distribution. For example, the non-uniformity could be mitigated such that voltage drops across PCM RF switches 100x, 100y, and 100z which would otherwise be eight volts (8 V), five volts (5 V), and two volts (2 V) would instead be six volts (6 V), five volts (5 V), and four volts (4 V), respectively. Then, wide heating element PCM RF switches and narrow heating element PCM RF switches can be used to make breakdown voltages $V_{BR1}$, $V_{BR2}$, and $V_{BR3}$ of PCM RF switches 100x, 100y, and 100z correspond to these six volts (6 V), five volts (5 V), and four volts (4 V) voltage drops respectively.

Thus, various implementations of the present application achieve a stacked PCM RF switch circuit that overcomes the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A radio frequency (RF) switching circuit comprising: a plurality of stacked phase-change material (PCM) RF switches comprising a high shunt capacitance PCM RF switch and a low shunt capacitance PCM RF switch; wherein said plurality of stacked PCM RF switches each includes a PCM, said PCM comprising material selected from the group consisting of germanium telluride ($Ge_XTe_Y$), germanium antimony telluride ($Ge_XSb_YTe_Z$), germanium selenide ($Ge_XSe_Y$), and a chalcogenide glass, and having a low-resistivity crystalline phase and a high-resistivity amorphous phase; said high shunt capacitance PCM RF switch having its heating element contacts near its PCM contacts; said low shunt capacitance PCM RF switch having its heating element contacts far from its PCM contacts; said low shunt capacitance PCM RF switch being positioned closer to an RF power source and said high shunt capacitance PCM RF switch being positioned farther from said RF power source such that an RF voltage across said RF switching circuit is uniformly distributed between said high shunt capacitance PCM RF switch and said low shunt capacitance PCM RF switch.

2. The RF switching circuit of claim 1, wherein said RF power source is an antenna, and said RF switching circuit is situated in an RF receive chain between said antenna and a low noise amplifier (LNA).

3. The RF switching circuit of claim 1, wherein said RF power source is a power amplifier, and said RF switching circuit is situated in an RF transmit chain between said power amplifier and an antenna.

4. The RF switching circuit of claim 1, wherein said RF power source is an antenna, and said RF switching circuit is situated in an RF receive chain between said antenna and a filter.

5. The RF switching circuit of claim 1, wherein said RF power source is a power amplifier, and said RF switching circuit is situated in an RF transmit chain between said power amplifier and a filter.

6. The RF switching circuit of claim 1, wherein said RF power source is an antenna, and said RF switching circuit is situated in an RF receive chain between said antenna and a mixer.

7. The RF switching circuit of claim 1, wherein said RF power source is a mixer, and said RF switching circuit is situated in an RF transmit chain between said mixer and an antenna.

8. The RF switching circuit of claim 1, wherein said high shunt capacitance PCM RF switch and said low shunt capacitance PCM RF switch each includes a heating element transverse to said PCM.

9. The RF switching circuit of claim 1, wherein said high shunt capacitance PCM RF switch is selected from the group consisting of a wide heating element PCM RF switch and a narrow heating element PCM RF switch.

10. The RF switching circuit of claim 1, wherein said low shunt capacitance PCM RF switch is selected from the group consisting of a wide heating element PCM RF switch and a narrow heating element PCM RF switch.

11. A radio frequency (RF) switching circuit comprising: a plurality of stacked phase-change material (PCM) RF switches comprising a wide heating element PCM RF switch and a narrow heating element PCM RF switch; wherein said plurality of stacked PCM RF switches each includes a PCM, said PCM comprising material selected from the group consisting of germanium telluride ($Ge_XTe_Y$), germanium antimony telluride ($Ge_XSb_YTe_Z$), germanium selenide ($Ge_XSe_Y$), and a chalcogenide glass, and having a low-resistivity crystalline phase and a high-resistivity amorphous phase; said wide heating element PCM RF switch having a large PCM active segment; said narrow heating element PCM RF switch having a small PCM active segment; said wide heating element PCM RF switch having a high breakdown voltage, and said narrow heating element PCM RF switch having a low breakdown voltage, said RF switching circuit distributing a high voltage drop across said wide heating element PCM RF switch and a low voltage drop across said narrow heating element PCM RF switch.

12. The RF switching circuit of claim 11, wherein said RF switching circuit is situated in an RF receive chain between an antenna and a low noise amplifier (LNA).

13. The RF switching circuit of claim 11, wherein said RF switching circuit is situated in an RF transmit chain between a power amplifier and an antenna.

14. The RF switching circuit of claim 11, wherein said wide heating element PCM RF switch and said narrow heating element PCM RF switch each includes a heating element transverse to said PCM.

15. The RF switching circuit of claim 11, wherein said wide heating element PCM RF switch is selected from the group consisting of a high shunt capacitance PCM RF switch and a low shunt capacitance PCM RF switch.

16. The RF switching circuit of claim 11, wherein said narrow heating element PCM RF switch is selected from the group consisting of a high shunt capacitance PCM RF switch and a low shunt capacitance PCM RF switch.

17. A method for uniformly distributing radio frequency (RF) voltage across a plurality of stacked phase-change material (PCM) RF switches in an RF switching circuit, wherein said plurality of stacked PCM RF switches each includes a PCM, said PCM comprising material selected from the group consisting of germanium telluride ($Ge_XTe_Y$), germanium antimony telluride ($Ge_XSb_YTe_Z$), germanium selenide ($Ge_XSe_Y$), and a chalcogenide glass, and having a low-resistivity crystalline phase and a high-resistivity amorphous phase, said method comprising:
    determining a first proximity of a first PCM RF switch to an RF power source;
    determining a second proximity of a second PCM RF switch to said RF power source;
    forming first heating element contacts of said first PCM RF switch at a first distance from first PCM contacts of said first PCM RF switch so as to result in a first shunt capacitance corresponding to said first proximity;
    forming second heating element contacts of said second PCM RF switch at a second distance from second PCM contacts of said second PCM RF switch so as to result in a second shunt capacitance corresponding to said second proximity.

18. The method of claim 17, wherein said RF power source is an antenna, and said RF switching circuit is situated in an RF receive chain between said antenna and a low noise amplifier (LNA).

19. The method of claim 17, wherein said RF power source is a power amplifier, and said RF switching circuit is situated in an RF transmit chain between said power amplifier and an antenna.

20. The method of claim 17, wherein said first PCM RF switch and said second PCM RF switch each includes a heating element transverse to said PCM.

21. A method for distributing a high voltage drop across a first phase-change material (PCM) radio frequency (RF) switch and a low voltage drop across a second PCM RF switch in a RF switching circuit, wherein said first and second PCM RF switches each includes a PCM, said PCM comprising material selected from the group consisting of germanium telluride ($Ge_XTe_Y$), germanium antimony telluride ($Ge_XSb_YTe_Z$), germanium selenide ($Ge_XSe_Y$), and a chalcogenide glass, and having a low-resistivity crystalline phase and a high-resistivity amorphous phase, the method comprising:
    determining a first proximity of said first PCM RF switch to an RF power source;
    determining a second proximity of said second PCM RF switch to said RF power source;
    forming a first heating element of a first width for said first PCM RF switch so as to result in a first breakdown voltage corresponding to said first proximity;
    forming a second heating element of a second width for said second PCM RF switch so as to result in a second breakdown voltage corresponding to said second proximity.

22. The method of claim 21, wherein said RF power source is an antenna, and said RF switching circuit is situated in an RF receive chain between said antenna and a low noise amplifier (LNA).

23. The method of claim 21, wherein said RF power source is a power amplifier, and said RF switching circuit is situated in an RF transmit chain between said power amplifier and an antenna.

24. The method of claim 21, wherein said first heating element and said second heating element are each transverse to said PCM.

* * * * *